United States Patent [19]

Reimers et al.

[11] Patent Number: 5,213,043

[45] Date of Patent: May 25, 1993

[54] NON-FILM LITHOGRAPHIC IMAGING

[76] Inventors: Gary L. Reimers, 2552 Winsford La., Carmichael, Calif. 95608; Joe Cole, 1308 Foxhollow Way; Bob Torres, 1122 Cresthaven Way, both of Roseville, Calif. 95678

[21] Appl. No.: 853,976

[22] Filed: Mar. 20, 1992

[51] Int. Cl.$^5$ ............................................... B41F 7/02
[52] U.S. Cl. .................................... 101/463.1; 101/467
[58] Field of Search ............... 101/450.1, 456, 463.1, 101/467, 471; 430/300, 302

[56] References Cited

U.S. PATENT DOCUMENTS

| | | | |
|---|---|---|---|
| 2,870,253 | 1/1959 | Crosfield et al. | 258/297 |
| 2,875,046 | 2/1959 | Marron et al. | 101/467 |
| 3,230,875 | 1/1966 | Newman | 101/471 |
| 3,259,061 | 7/1966 | Wiswell | 101/467 |
| 3,274,929 | 9/1966 | Newman | 101/467 |
| 3,485,629 | 12/1969 | Yamada et al. | 101/467 |
| 3,648,603 | 3/1972 | Kaminstein | 101/463.1 |
| 3,867,150 | 2/1975 | Ketley | 101/467 |
| 4,064,205 | 12/1977 | Landsman | 101/467 |
| 4,634,659 | 1/1987 | Esumi et al. | 430/302 |
| 5,058,500 | 10/1991 | Mizuno | 101/463.1 |
| 5,073,218 | 12/1991 | Aggio | 101/470 |

OTHER PUBLICATIONS

The Penrose Annual, vol. 45 (1950), p. 134 and FIGS.

Primary Examiner—Edgar S. Burr
Assistant Examiner—Stephen R. Funk
Attorney, Agent, or Firm—James M. Ritchey

[57] ABSTRACT

A non-film requiring method for applying information to a light sensitive emulsion coated lithographic printing plate comprises obtaining the information applied to a sheet of paper based material, wherein the sheet applied information is essentially opaque to light emanating from a light source and the sheet of paper based material is generally transmissive to the light, positioning the information applied sheet on the printing plate to cover at least a portion of the emulsion, and exposing the sheet covered printing plate to the light thereby directly transferring the information to the printing plate without the necessity of film.

20 Claims, 4 Drawing Sheets

NON-FILM LITHOGRAPHIC IMAGING

BACKGROUND OF THE INVENTION

1. Field of the Invention

The subject process relates to a lithographic method for printing. More specifically, a non-film requiring process for transferring an image to a printing plate is disclosed.

2. Description of the Background Art

Traditional methods of lithographic printing for transferring an image to a printing plate have involved a step that requires the use of film. Such film requiring processes are time consuming and, including the film and associated processing machines, extremely expensive. With the advent of relatively inexpensive photocopy machines and the creation of photocopy facilities on virtually every street corner, to compete, printing houses employing standard photographic film intensive lithographic means have found a critical need for an advancement in these traditional lithographic techniques.

In an ordinary or traditional lithographic procedure for transferring an image to a printing plate the process begins by obtaining original camera ready copy by standard paste-up techniques or by computer aided typesetting or imagesetting. Screen tints and halftoned photographs are either pasted into the camera ready copy directly or specified to be placed later as part of the stripping process. If generated by desktop publishing means, all copy is digitally scanned and positioned electronically for output to film or paper.

Next, mechanical copy is shot on a graphic arts camera to produce individual film negative pages. These pages must be taken, retouched to fill in pinholes and cutlines, and then stripped into pin registered flats, usually mylar, with proper margin positioning and imposition for press and bindery specifications. Flats are then masked off to cover unwanted open areas. In stripping, press and bindery marks are incorporated into each flat or are laid up into a double exposure flat for imaging to a plate.

Using a high intensity UV light source, the flats are then proofed by contact exposure onto blueline proofing paper. Proofs are then folded and trimmed to represent the finished printer and bound product.

After approval and corrections, the film stripping flats are then used to expose the image to a photosensitive printing plate, typically negative acting. The unexposed image is dissolved away in the development process leaving an ink receptive image. After an application of preserving gum, the plates are ready for press.

In the article "Lithographic Plates by Xerography" (*Penrose Annual*, Vol. 45, page 134, 1951) paper lithographic plates are mentioned as being substitutional in a xerographic process for a paper sheet in the transfer operation.

More specifically, in reference to issued patents, U.S. Pat. No. 2,870,253 describes a method of production of printing surfaces. An electrical discharge is used to etch plates having a rigid electrically-conducting backing and a partially electrically-conducting surface.

A photo process is disclosed in U.S. Pat. No. 3,485,629. A positive microfilm frame is employed in this process.

A machine for copying an original, making a master from the original, and printing from the master is related in U.S. Pat. No. 3,648,603. Electrophotography is used an offset type printing machine to produce a printing master. A coating of a thin thermoplastic hydrocarbon is applied to a photoconductive surface of a sheet which makes it oleophilic. The toner image is applied in the usual manner. The oleophilic background is coated with oil and rejects an aqueous ink. The porous toner image absorbs the oil and provides a surface to which the viscous aqueous ink adheres.

U.S. Pat. No. 3,867,150 demonstrates a printing plate process and apparatus using a laser scanned silver negative. Surfaces are formed in relief such as a printing plate. The laser forms an optical mask by generating opaque areas in an essentially transparent, dry silver sheet. Heat is applied to the exposed sheet to develop the latent image. The resulting optical mask is used for imaging on a photosensitive printing plate.

U.S. Pat. No. 4,064,205 provides a method for making a printing plate from a porous substrate. A paste-up is laser scanned and the information transferred, via another laser, to a printing plate.

A processing-free planographic printing plate and method of use are described in U.S. Pat No. 4,634,659. A light source passes light through a lens having a reflective backing to strike a subject image. Light returning from the subject image reflect from the angled back surface and to a light sensitive plate.

Finally, an apparatus and printing system for developing a lithographic plate for printing are disclosed in U.S. Pat. No. 5,058,500. As usual, film is involved in the initial steps of producing a printing plate.

SUMMARY OF THE INVENTION

An object of the present invention is to eliminate the need for film in lithographic printing procedures.

Another object of the present invention is to create a lithographic printing method that requires significantly fewer environmentally dangerous chemicals to produce printing plates.

An additional object of the present invention is to disclose a method of photodirect imaging that proceeds at once from computer information files or a printed paper sheet to a printing plate.

A further object of the subject invention is to generate a positive plate lithographic printing method that does not require masking materials since clear tape is used to attach pages rather than expensive red litho tape.

Yet another object of the present invention is to produce a method of lithography that is significantly quicker and less costly to employ than traditional lithographic means. No film means that the printer does not need to pay a camera operator to load pages into a camera and shoot. Also, no film means there is no cutting apart, trimming, and sorting of negative film pages for stripping into imposed flats. An experienced stripper is not required to position pages. A less costly apprentice can be trained to accurately place pages onto carriers. Additionally, less handling means lower overall job costs.

Still another object of the subject invention is to generate a method that results in a faster turn-around time for printing a project.

Still a further object of the subject invention is to relate an improved lithographic method that requires fewer and less expensive pieces of equipment. Film shooting and developing equipment is eliminated, as are film storage and protection devices.

Still yet another object of the present invention is the production of generally better quality prints. Traditional plate making from film negatives and positives requires that the contacting glass, mylar base, and overlays be spotless to ensure that no pinholes show up in the solid images of the plate. Since the paper base of the subject method acts as a diffuser, all dust shadows, cut lines, and debris above the paper base are diffused. Only the image from the photoprint paper is transferred to the plate during the contacting process. Images shot through a conventional process camera suffer various forms of image degradation due to optical distortion and the inability of film to capture an exact reproduction from a projected image. A common problem, overcome by the subject method, is encountered in the reproduction of pre-screened halftones (copydot) through the camera lens. Usually, a dot loss of 5-10% can be expected when shooting from halftoned copy originals to line film. With the subject method images are transferred from paper output material directly to the metal plate emulsion. Emulsion to emulsion contacting renders exact dot for dot image quality. Size distortion introduced into the reproduction process due to camera non-calibration is not a factor with the subject device and images are transferred in generally the exact same size. With the subject process, variations of image density due to exposure and development inconsistencies with the film are essentially eliminated.

Due to the creation and coming together of key technological developments (i.e., computer aided word processing and document publishing and laser printers), wide distribution of these developments, and a relatively inexpensive cost for these developments, the subject process is readily available to society without the high expenses associated with traditional lithography. The subject process disclosed is a non-film lithographic printing method comprising a paper based material as a substitute for the traditional film. The subject non-film requiring method for applying information to a light sensitive emulsion coated lithographic printing plate, comprises the steps of obtaining the information applied to a sheet of paper based material, wherein the sheet applied information is essentially opaque to light emanating from a light source and the sheet of paper based material is generally transmissive to the light. Further, in the subject method the information applied sheet is positioned on the printing plate to cover at least a portion of the emulsion. The sheet covered printing plate is exposed to the light thereby transferring the information to the printing plate without the necessity of employing costly and time consuming film manipulations.

Other objects, advantages, and novel features of the present invention will become apparent from the detailed description that follows, when considered in conjunction with the associated drawings.

DESCRIPTION OF THE PREFERRED EMBODIMENT

Figure 1:
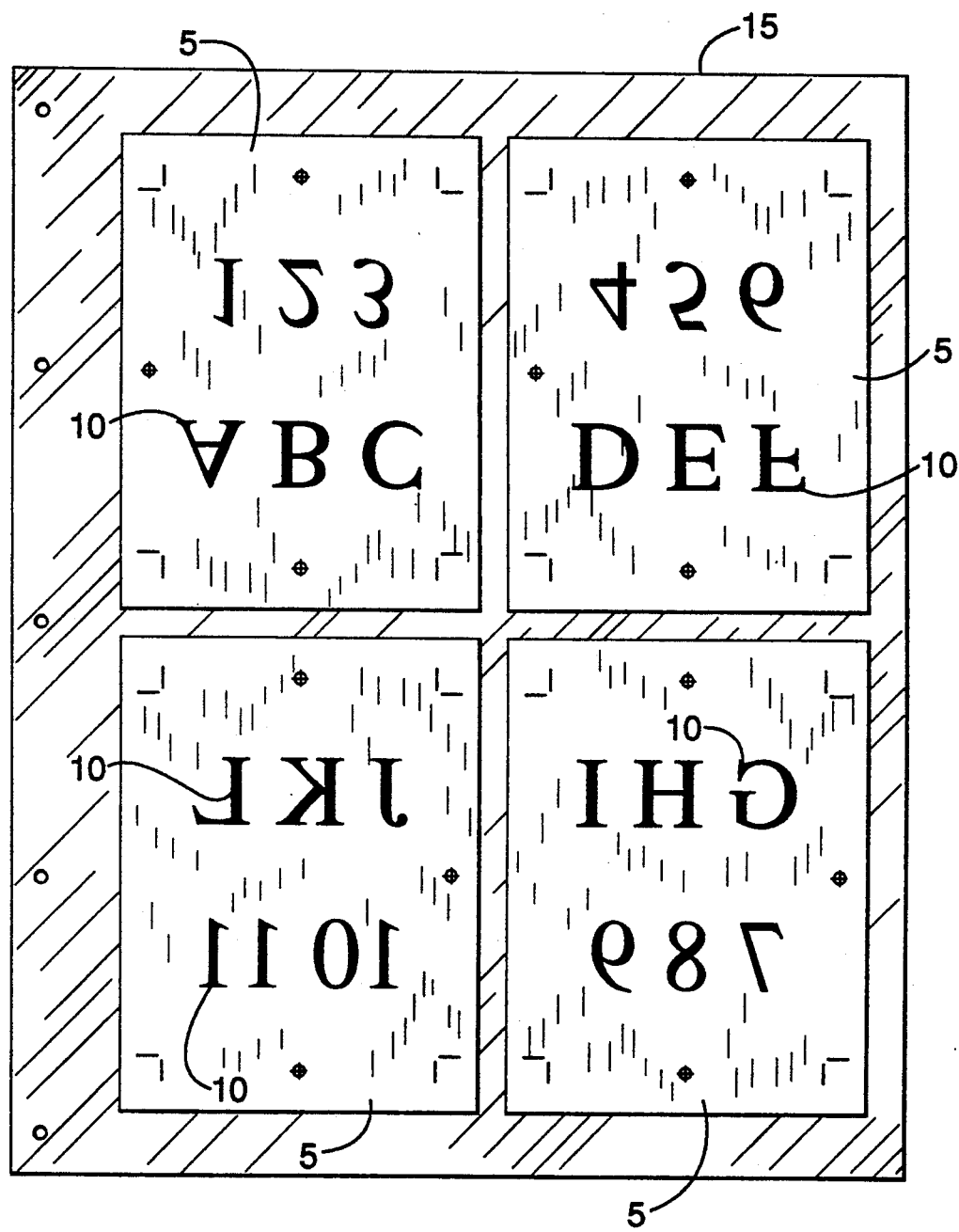
FIG. 1 is an overhead view of the subject invention showing paper based material sheets having a positive, mirror image adhered to a light transmissive printing plate page carrier.
Figure 2:
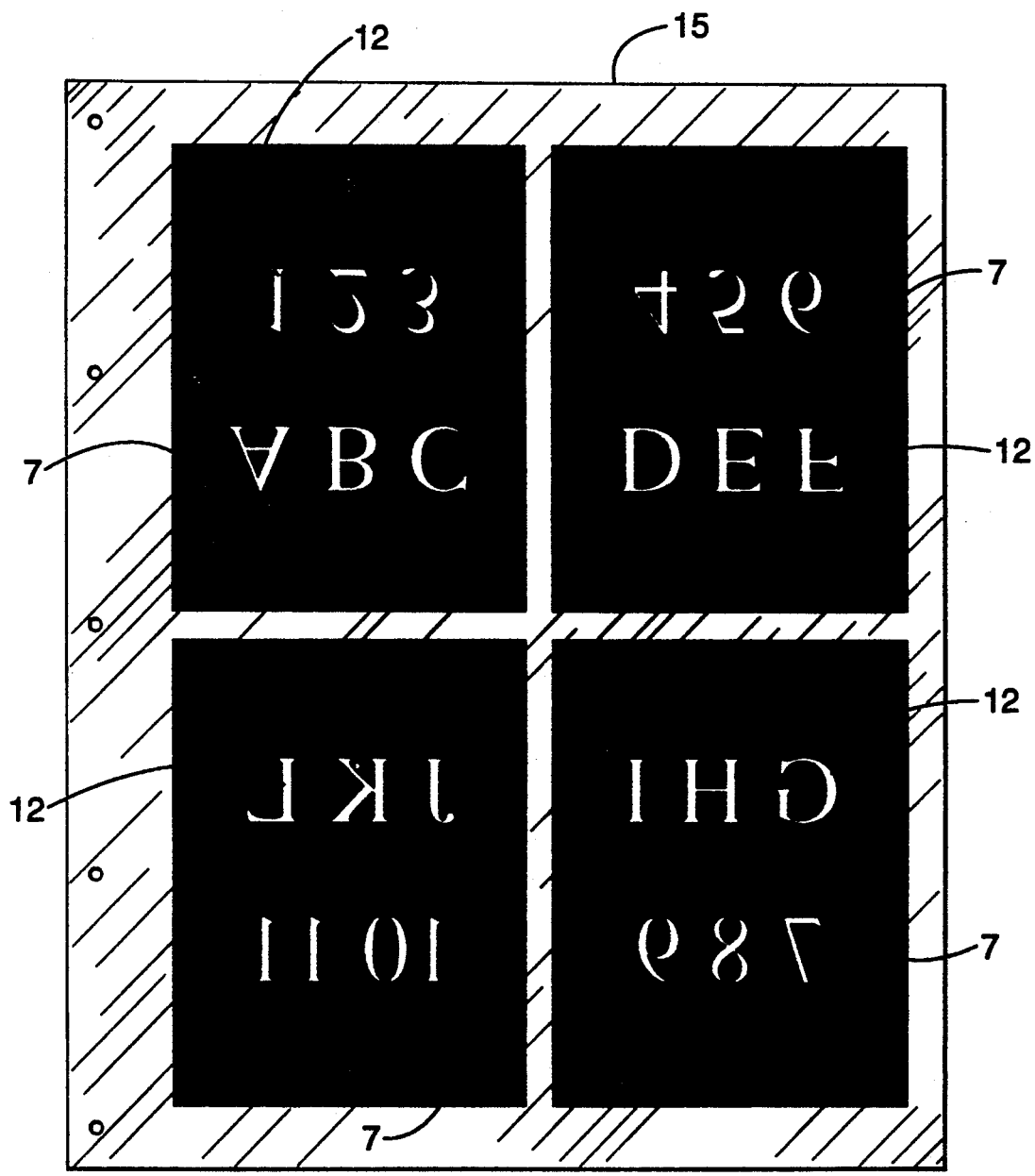
FIG. 2 is an overhead view of an alternate embodiment of the subject invention showing paper based material sheets having a negative, mirror image adhered to a light transmissive printing plate page carrier.

Referring now to FIGS. 1-4, there is shown a preferred embodiment of a non-film requiring process for creating printing plates for lithographic printing. Generally, the subject process permits a user to replace costly film in lithographic printing with inexpensive paper. For the majority of uses in an average lithographic printing situation, the subject process involves positive printing plates, however, negative plates are easily produced by the subject method. Employing the subject invention, both negative and positive plate techniques are described below.

The information to be printed is of any customary type including, but not limited to, alphanumeric information, figures, tables, charts, graphs, pictures, and the like. The information is transferred as images to a paper based material. The paper based material has light transmission characteristics that permit the relatively unhindered passage of plate exposing light. The transferred images must be dark enough to block essentially all of the transmission of light. Given suitable exposure times, most non-colored or white paper based materials of about 25 pound bond and lower suitably transmit the required light to produce an exposed plate and even bond weights higher than 25 may produce suitable transmission characteristics for producing an acceptably sharp final printed product. Further, paper based materials include traditional wood and cloth paper products and equivalent materials of natural and synthetic polymers and the like that are later developed.

As long as the intensity is sufficient to expose properly the printing plate during a selected printing exposure time interval, the light source employed is a standard device and bulb used in the lithographic printing business. By way of example, a 10 kilowatt light source was employed to generate acceptable exposures over time intervals ranging from a few seconds to many minutes. Usually, the light source emits mostly UV radiation, therefore, the paper based material is essentially UV transmissive (block a minimum of the incoming light), but other wavelengths suitable for exposing the selected printing plate are acceptable and considered within the nature of this disclosure.

In the following exemplary description of a preferred usage of the subject method a typical print shop is used as an illustration of how the subject method is practiced, but it is stressed that other equivalent procedures are well within the realm of this disclosure, including, but not limited to, home use and usage in non-traditional lithographic printing environments. If the information to be printed with the subject process is not in acceptable form initially, the information needs to be in computer readable form. Computer readable form information implies that the information is in a computer file or may be placed in a computer file by traditional entry means or is in a form that is suitable for scanning into a computer file. The computer file is typically one that is acceptable by a word processor program, desktop publishing program, dedicated commercial imagesetting program, and the like.

The computer file or files that contain the information to be printed with the subject process are appropriately formatted and used to send the information to a means for printing such as a POSTSCRIPT TM imagesetter (LINOTRONIC TM), proprietary phototypesetter, a laser printer, and similar devices. The printed information must be suitably opaque to the light used to expose the printing plate. The print density of the image outputting device is normally subject to a user's direct control. Further, the edges of the information (the transition regions from the blocking to transmitting light areas on the paper material) must be of sufficient definition to produce the desired image outline. Even a standard 300 dpi laser printer produces very satisfactory image edge sharpness, as do the more sophisticated and higher resolution photocopiers currently available.

Printing plates employed in the subject process that are either positive or negative acting are available from standard suppliers and include plate types yet to be developed either for this subject process or other uses. Currently, suitable plates may be obtained from such companies as: Eastman Kodak Company, Graphic Imaging Systems Division.; Fuji Photo Film USA Inc., Graphic Systems Division; Hoechst Celanese Corp., Printing Products North America; Polychrome Corp.; 3M Image Reprographic System Division of Printing & Publishing Systems; and similar suppliers.

POSITIVE PRINTING PLATE PROCESS

This example and the following one with a negative plate represent only the normal implementation of the subject device and other equivalent step and component combinations and standard variations used in the lithographic arts are within the realm of this disclosure.

1. Preparing Imageset copy.

When positive printing plates are employed in the subject process the information within the computer file is employed to generate on a white background paper page 5 a dark or positive, mirror-image or "flopped to wrong reading" image 10 (see FIG. 1).

Images are generated on an imageset page by a laser printer or imagesetter with the capacity of flopping the page output image to a mirror reading form. The image receiving paper is of minimum caliper to withstand handling and to transmit sufficient exposing light so as to not shadow the plate with the page's outer edge outline. Standard photocopier bonds easily function to satisfactorily receive printable images without shadowing the plate.

Halftones and other elements on paper based material are added to the imageset page by cutting in and taping elements on the back-side of the imageset page with clear, exposing light transmissive, tape. Emulsion up/wrong reading images on film positives (including halftones and tints) are positioned directly to the front-side of the imageset pages using clear tape or an adhesive such as SPRAYMOUNT TM. No whiteout (paper colored paint) or equivalent opaque materials are used in the paste-up process as light is blocked to the underlying plate. No layering or overlapping of paper is employed as this will effect the light density to the plate.

2. Positioning Imageset Pages to Press Format.

A press layout is generated either on a ruleup table or by means of an automated stepping system and is done in positive or negative depending on the user's preference. All of the page positions have accurate centerlines for line-up purposes. Optionally, other margin lines are added for actual placement of standardized position elements (running rules, headers, folios, and the like) of the page layout.

A positive marks layout is generated using the stepper or working from a stripped-up marks flat that is then contacted into positive contact film. This master is used to lay over each form during the plate making and proofing process.

An imposition form is generated either manually or by computer to allow for proper imposition of pages. In some shops a hand assembled folding dummy is used for imposition. Further, imageset pages are trimmed to final page size or under to ensure no overlap.

Imageset pages are laid into proper page position on a clear page carrier 15 (see FIGS. 1–4) such as mylar with wrong reading images. Clear, essentially exposing light transmissive tape (such as 3M MAGIC TAPE TM) is used to adhere the pages to the mylar. Margin lines on the positive layout are used for final positioning. With the pages laid in place a mirror image is generated of what the final press form is to look like when printed.

Usually, the form numbers and press identifiers are generated wrong reading off a laser printer or imagesetter and photocopied. These are then cut and clear taped into the appropriate positions on the mylar page carrier. A master job identifier tag is placed on the master marks positive and is burned into position. Any other marks or identifiers needed are easily clear taped onto the carrier.

3. Proofing the flats.

A proof is produced from the imposed flats. DYLUX TM, or similar material, is punched and then placed onto a pin register board in a contact frame. Page forms are placed face down onto the DYLUX TM so the image on the paper is in contact with the DYLUX TM emulsion. The master marks positive is placed over the face-down form and the contact frame glass closed.

After proper drawn down (usually with a vacuum), an initial clearing exposure is made through the appropriate clearing filter material. Next, if required, double exposures are made. The second side is exposed in the same manner.

After the clearing exposure, the material is exposed, with no vacuum, uncovered using the high UV DYLUX TM (KOKOMO TM) exposure filter. This turns the uncleared image area blue on the DYLUX TM material while retaining a white background. A proper balance between exposure times is arrived at through exposure testing. An alternate freestanding timed UV light source may be utilized to post expose the DYLUX TM that is cleared in the contact frame.

After exposure the DYLUX TM is folded down and trimmed as a final representation of what the job will look like when finished. Since this is an unconventional usage of the DYLUX TM material, the image quality is not as good as that obtained with working from negative film, but is suitable for pagination and positional checks.

4. Plate Making of Flats.

Figure 3:
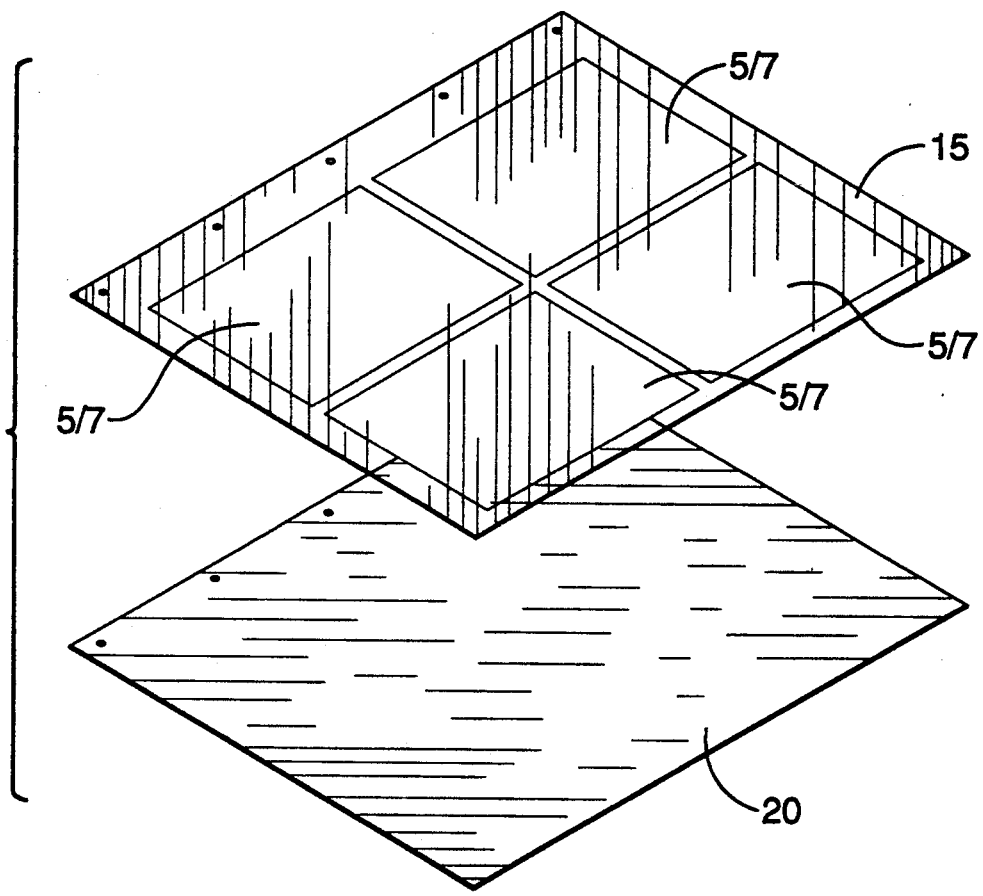
FIG. 3 is a perspective view of the subject invention showing the alignment of paper based material sheets and associated page carrier over a printing plate.
Figure 4:
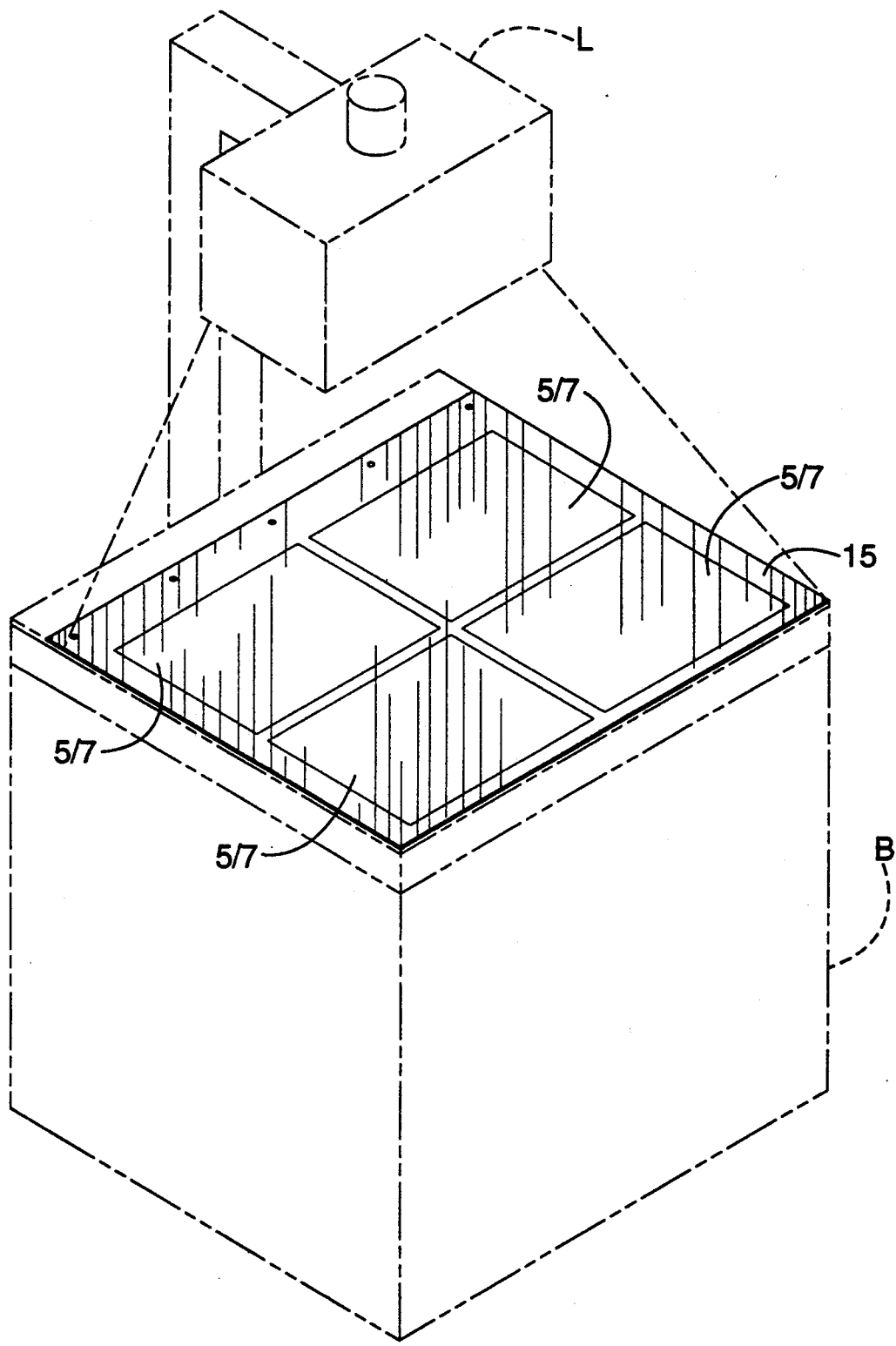
FIG. 4 is a perspective view of the subject invention showing a printing plate with associate page carrier and paper based material being exposed to illumination.

FIG. 3 shows the alignment of the imageset pages (either mirror-imaged positive 5 or negative 7) mounted on a carrier 15 to an underlying plate 20. Illustrated in FIG. 4 is the general process of exposing the carrier 15 covered plate 20, both sitting on a suitable base B that may include a vacuum source, with a suitable light source L. Preferably, plate making, using the subject method, is done with highspeed positive (for this example) acting plates, although slow speed plates do function in the subject process. The positive plate accepts the copy information transfer as ink-bearing images on non-inking plate backgrounds.

For plates produced from imposed page flats, the plate is punched and placed onto a pin register board in the contact frame. Page forms are then placed face down onto the plate so the image on the paper is in contact with the plate emulsion. The master marks positive is placed face-down over the face-down page form and the contact frame glass is closed.

After proper draw down an exposure is made. Care is taken to be sure the exposure is long enough to burnout the background of the positive acting plates through the paper based material. To insure proper exposure, test exposures using plate scales are made through the paper based material.

The plates are developed and gummed according to the plate manufacture's recommendations. The plates are inspected, slipsheeted and, if needed, packaged for delivery to the press.

NEGATIVE PRINTING PLATE PROCESS

With negative printing plates the subject method is more like the conventional use of film negatives in plate making, except that the images are on a less expensive paper material.

1. Preparing Imageset Copy.

All type and layout must be in computer readable form, as with the above description for positive plate making. Output, however, is generated in a mirror-imaged or wrong-reading form, but is negative or a black background paper page 7 with white type 12 (see FIG. 2). Ideally, the black background is especially dense and free from pinholes.

Since many current low-end laser printers have inconsistencies in the quality of printing large blackened areas, laser printing of the images is not preferred for use as imaging copy when using negative plates. However, further laser printer developments may overcome this limitation of the use of high resolution laser printers or imagesetters, thereby permitting a user to employ a laser printer with negative plates.

Halftones and other elements are used in negative wrong-reading and are added by cutting in and taping elements with standard red lithographers tape to close gaps. Other elements (including process color) is added using conventional double burns to the plate. No whiteout or opaque material are used in the white image areas as the exposing light is blocked to the plate. Layering or overlapping of paper is acceptable with the negative direct plate version of the subject process.

2. Positioning Imageset Pages to Press Format.

A press layout is generated either on a rule-up table or by means of an automated stepping system and is done in positive or negative depending upon preference. Page positions have accurate centerlines for line-up purposes. Other margin lines are added for actual placement of standardized position elements of the page layout.

A negative plate mask incorporating marks is generated using a stepper or by cutting ruby windows. This master is used to lay over each form during the plate making and proofing process to block out margin areas not to be exposed and to add bindery and press marks (an assembler has the option of masking the flats with goldenrod and double burning the press marks).

An imposition form is generated either manually or by computer to allow for proper imposition of pages. A hand produced folding dummy may suffice for smaller jobs.

Imageset pages are laid into proper page position on a page carrier 15, usually mylar, with the wrong-reading image up. Red or clear tape is used to adhere pages to the mylar. Margin lines on the positive master layout are used for final positioning. Layout is to be done as a mirror image of how the final press form appears when printed.

Form numbers and, identifiers are generated in negative form and cut and taped into the appropriate positions on the mylar page carrier. A negative master job identification tag is placed on the master page window flat to be burned into position. Any other marks or identifiers are easily taped onto the carrier.

3. Proofing the Flats.

Proofing from reversed imageset materials is done in the same manner as proofing from negative materials. Exposures are usually somewhat longer to achieve a good image.

To produce the proof from imposed page flats, the DYLUX TM is punched and then place onto a pin register board in a contact frame. Page forms are then placed face down onto the DYLUX TM so the image on the paper is in contact with the DYLUX TM emulsion. The master page window flat is placed over the face-down form and the contact frame glass is closed.

After proper drawn down and exposure is made through the UV (KOKOMO TM) filter. All of the double burns are exposed. The second side is exposed in the same manner.

After the UV exposure, the DYLUX TM is cleared using an appropriate clearing filter. A freestanding clearing light may be used for clearing the DYLUX TM.

After the DYLUX TM is exposed it is folded and trimmed as a final representation of how the job will appear when finished. Since this is an unconventional use of DYLUX TM materials, the image quality is not as good as that obtained with working from regular negative film, but is sufficient for pagination and positional checks.

4. Plate Making of Flats.

Preferably, plate 20 making using this variation or embodiment of the subject invention is done using high-speed negative acting plates. This allows copy to be imaged as non-ink bearing backgrounds with ink bearing images. See FIG. 3 for the alignment of a carrier 15 to a plate 20.

Plates are produced from imposed page flats with the plate punched and then placed onto a pin register board in the contact frame. Page forms are then placed face down onto the plate so the image on the paper is in contact with the plate emulsion. The master page window flat is placed over the face-down form and the contact frame glass closed.

After proper draw down on a supporting base B, an exposure is made with a suitably strong light source L (see FIG. 4). Care is taken to be sure that the exposure is sufficiently long to expose a durable image through the paper based material. Test exposures using plate scales are made through the paper base material.

The plates are then developed and gummed using the plate manufacturer's recommended procedures. A post exposure of a plate is done through a high UV filter. This post exposure hardens the image for a longer press run. The filtered UV light source can be at the back end of the processor. Finally, the plates are inspected, slipsheeted, and packaged, if desired, for delivery to the press.

The invention has now been explained with reference to specific embodiments and in terms used in the relevant art or described above. Other embodiments will be suggested to those of ordinary skill in the appropriate art upon review of the present specification.

Although the foregoing invention has been described in some detail by way of illustration and example for purposes of clarity of understanding, it will be obvious that certain changes and modifications may be practiced within the scope of the appended claims.

What is claimed is:

1. A non-film requiring method for applying information to a light sensitive emulsion coated lithographic printing plate, comprising the steps of:
   a) acquiring an image of said information applied to one surface of a sheet of paper based material;
   b) positioning said information image applied sheet on said printing plate to cover at least a portion of said emulsion, wherein said positioning step directly contacts said image on said one surface with said plate emulsion; and
   c) exposing said sheet covered printing plate to a light from a light source thereby transferring said information to said printing plate.

2. A method according to claim 1, further comprising the initial steps of:
   entering said information into a computer and
   outputting from said computer said information onto said sheet of paper based material.

3. A method according to claim 1, further comprising the initial steps of:
   entering said information into a computer and
   outputting from said computer said information in a positive, mirror image form onto said sheet of paper based material, wherein said sheet applied information is essentially opaque said light emanating from said light source and said sheet of paper based material is generally transmissive to said light.

4. A method according to claim 1, further comprising the initial steps of:
   entering said information into a computer and
   outputting from said computer said information in a negative, mirror image form onto said sheet of paper based material, wherein said sheet applied information is generally transmissive to said light and a background of said sheet of paper based material is essentially opaque to said light emanating from said light source.

5. A method according to claim 1, further comprising the initial steps of:
   entering said information into a computer and
   outputting from said computer by means of a laser printer said information onto said sheet of paper based material.

6. A method according to claim 1, further comprising the initial steps of:
   entering said information into a computer and
   outputting from said computer by means of an imagesetter said information onto said sheet of paper based material.

7. A method according to claim 1, further comprising the initial steps of:
   entering said information into a computer and
   outputting from said computer by means of a laser printer said information in a positive, mirror image form onto said sheet of paper based material, wherein said sheet applied information is essentially opaque to said light emanating from said light source and said sheet of paper based material is generally transmissive to said light.

8. A method according to claim 1, further comprising the initial steps of:
   entering said information into a computer and
   outputting from said computer by means of an imagesetter said information in a positive, mirror image form onto said sheet of paper based material, wherein said sheet applied information is essentially opaque to said light emanating from said light source and said sheet of paper based material is generally transmissive to said light.

9. A method according to claim 1, further comprising the initial step of:
   entering said information into a computer and
   outputting from said computer by means of a laser printer said information in a negative, mirror image form onto said sheet of paper based material, wherein said sheet applied information is generally transmissive to said light and a background of said sheet of paper based material is essentially opaque to said light emanating from said light source.

10. A method according to claim 1, further comprising the initial steps of:
    entering said information into a computer and
    outputting from said computer by means of an imagesetter said information in a negative, mirror image form onto said sheet of paper based material, wherein said sheet applied information is generally transmissive to said light and a background of said sheet of paper based material is essentially opaque to said light emanating from said light source.

11. A non-film requiring lithographic printing method, comprising the steps of:
    a) acquiring an image of information applied to one surface of a sheet of paper based material;
    b) positioning said information image applied paper based sheet to cover at least a portion of a light sensitive emulsion on a printing plate, wherein said positioning step directly contacts said image on said one surface with said plate emulsion;
    c) exposing said sheet covered printing plate to a light from an essentially UV radiation producing light source thereby transferring said information to said printing plate; and
    d) employing said light exposed printing plate to print a page.

12. A method according to claim 11, further comprising the initial steps of:
    entering said information into a computer and
    outputting from said computer said information onto said sheet of paper based material.

13. A method according to claim 11, further comprising the initial steps of:
    entering said information into a computer and
    outputting from said computer said information in a positive, mirror image form onto said sheet of paper based material, wherein said sheet applied information is essentially opaque to said light emanating from said light source and said sheet of paper based material is generally transmissive to said light.

14. A method according to claim 11, further comprising the initial steps of:
    entering said information into a computer and outputting from said computer said information in a negative, mirror image form onto said sheet of paper based material, wherein said sheet applied information is generally transmissive to said light and a background of said sheet of paper based material is essentially opaque to said light emanating from said light source.

15. A method according to claim 11, further comprising the initial steps of:

entering said information into a computer and outputting from said computer by means of a laser printer said information onto said sheet of paper based material.

16. A method according to claim 11, further comprising the initial steps of:

entering said information into a computer and outputting from said computer by means of an imagesetter said information onto said sheet of paper based material.

17. A method according to claim 11, further comprising the initial step of:

entering said information into a computer and outputting from said computer by means of a laser printer said information in a positive, mirror image form onto said sheet of paper based material, wherein said sheet applied information is essentially opaque to said light emanating from said light source and said sheet of paper based material is generally transmissive to said light.

18. A method according to claim 11, further comprising the initial steps of:

entering said information into a computer and outputting from said computer by means of an imagesetter said information in a positive, mirror image form onto said sheet of paper based material, wherein said sheet applied information is essentially opaque to said light emanating from said light source and said sheet of paper based material is generally transmissive to said light.

19. A method according to claim 11, further comprising the initial steps of:

entering said information into a computer and outputting from said computer by means of a laser printer said information in a negative, mirror image form onto said sheet of paper based material, wherein said sheet applied information is generally transmissive to said light and a background of said sheet of paper based material is essentially opaque to said light emanating from said light source.

20. A method according to claim 11, further comprising the initial steps of:

entering said information into a computer and outputting from said computer by means of an imagesetter said information in a negative, mirror image form onto said sheet of paper based material, wherein said sheet applied information is generally transmissive to said light and a background of said sheet of paper based material is essentially opaque to said light emanating from said light source.

* * * * *